US 6,590,773 B1

(12) United States Patent
Lin

(10) Patent No.: US 6,590,773 B1
(45) Date of Patent: Jul. 8, 2003

(54) HEAT DISSIPATION DEVICE FOR ENHANCED POWER LIGHT EMITTING DIODES

(75) Inventor: Ming-Te Lin, Taipei Hsien (TW)

(73) Assignee: Para Light Electronics Co., Ltd., Taipei (TW)

( * ) Notice: Subject to any disclaimer, the term of this patent is extended or adjusted under 35 U.S.C. 154(b) by 0 days.

(21) Appl. No.: 10/228,946

(22) Filed: Aug. 28, 2002

(51) Int. Cl.[7] .................................................. H05K 7/20
(52) U.S. Cl. ........................ 361/704; 361/709; 361/717; 361/718; 361/802; 362/373; 257/675; 257/706
(58) Field of Search ................................. 361/704, 707, 361/709, 710, 717–719, 760, 767, 768, 782, 801, 802, 807, 809; 257/706, 675, 712, 713; 362/373, 580; 174/16.1, 16.3; 165/80.3, 185

(56) References Cited

U.S. PATENT DOCUMENTS

| | | | | |
|---|---|---|---|---|
| 4,667,270 A | * | 5/1987 | Yagi ............................ 361/820 |
| 5,612,855 A | * | 3/1997 | Heeb et al. .................. 361/773 |
| 6,045,240 A | * | 4/2000 | Hochstein .................... 362/294 |
| 6,349,908 B1 | * | 2/2002 | Rushansky et al. ......... 248/200 |
| 6,428,189 B1 | * | 8/2002 | Hochstein .................... 362/373 |
| 6,472,823 B2 | * | 10/2002 | Yen ............................. 315/112 |
| 6,481,874 B2 | * | 11/2002 | Petroski ...................... 362/373 |
| 6,517,229 B2 | * | 2/2003 | Suzuki et al. ............... 362/580 |

* cited by examiner

Primary Examiner—Boris Chervinsky
(74) Attorney, Agent, or Firm—Troxell Law Office PLLC

(57) ABSTRACT

A heat dissipation device is mounted to a light emitting diode device for removing heat from the light emitting diode which includes a substrate having a top side on which a light-emitting unit is formed and an opposite bottom side from which terminals extend. The heat dissipation device includes a plate made of heat conductive material and forming a receptacle for receiving and at least partially enclosing and physically engaging the substrate of the light emitting diode device for enhancing heat removal from the light emitting diode device.

9 Claims, 14 Drawing Sheets

HEAT DISSIPATION DEVICE FOR ENHANCED POWER LIGHT EMITTING DIODES

FIELD OF THE INVENTION

The present invention generally relates to enhanced power light emitting diodes (LEDs), and in particular to a heat dissipation device for externally mounting to the enhanced power LED device for improving the performance thereof.

BACKGROUND OF THE INVENTION

An enhanced power light emitting diode (LED) device as shown in FIG. 13 of the attached drawings comprises a substrate on which a light-emitting unit is formed and a plurality of terminals extending from the substrate. The terminals are soldered to a circuit board to mount the LED device to the circuit board.

The enhanced power LED is lightweight and consumes less power as compared to the conventional lightening devices. However, due to the illumination efficiency of the enhanced power LED, the luminance of the LED is much less than that of the conventional lightening devices. One way to compensate the poor luminance is to increase the electrical current flowing through the LED. Increasing current, however, leads to rise of heat generated. The heat is transmitted to and dissipated through the circuit board to which the LED device is mounted. The circuit board, however, is generally made of insulation material that is poor in transmitting and dissipating heat. Consequently, the power of the LED is subject to certain constraints and cannot be further enhanced.

FIG. 14 shows a diode packaged by resin material. A metal casing houses the diode package. The metal casing, however, is not to help removing heat from the diode for the diode in question does not generate a great amount of heat. The metal casing is, in fact, an electromagnetic shielding, rather than a heat dissipation device.

It is thus desired to provide a heat dissipation device for enhanced power LEDs to overcome the problems discussed above.

SUMMARY OF THE INVENTION

An object of the present invention is to provide a heat dissipation device externally mounted to an LED device for effectively removing heat from the LED.

Another object of the present invention is to provide a heat dissipation device for removing heat from an LED and enhancing the performance of the LED device.

To achieve the above objects, in accordance with a preferred embodiment of the present invention, there is provided a heat dissipation device adapted to be mounted to a light emitting diode device for removing heat from the light emitting diode, the light emitting diode device comprising a substrate having a top on which a light-emitting unit is formed and an opposite bottom from which terminals extend. The heat dissipation device comprises a plate made of heat conductive material and forms a receptacle for receiving and at least partially enclosing and physically engaging the substrate of the light emitting diode device with the top and thus the light-emitting unit exposed through a top opening of the receptacle. The receptacle defines opposite end openings for extension of the terminals of the light emitting diode device. Stop tabs are formed on opposite edges of each end opening for engaging ends of the substrate and thus retaining the light emitting diode device in the receptacle.

To achieve the above objects, in accordance with another embodiment of the present invention, there is provided a heat dissipation device adapted to be mounted to a light emitting diode device for removing heat from the light emitting diode, the light emitting diode device comprising a substrate having a top on which a light-emitting unit is formed and an opposite bottom from which terminals extend. The heat dissipation device is externally mounted to and at least partially encloses and physically engages the substrate of the light emitting diode device. The heat dissipation device comprises first and second members made of heat conductive material. The first member forms a receptacle for receiving the substrate of the light emitting diode device therein with the bottom of the substrate positioned on and supported by a bottom of the receptacle. The top and thus the light-emitting unit of the light emitting diode device are exposed through a top opening of the receptacle. The first member defines end openings for extension of the terminals of the light emitting diode device. Stop tabs are formed on opposite edges of each end opening for engaging ends of the substrate and thus retaining the light emitting diode device in the receptacle. The second member is mounted to the first member and physically engages the top of the substrate thereby interposing the substrate between the first and second members. The second member defines a central opening to expose the light-emitting unit and comprises perpendicular extensions engaging opposite ends of the substrate of the light emitting diode device.

To achieve the above objects, in accordance with a further embodiment of the present invention, there is provided a heat dissipation device adapted to be mounted to a light emitting diode device for removing heat from the light emitting diode, the light emitting diode device comprising a substrate having a top on which a light-emitting unit is formed and an opposite bottom from which terminals extend. The heat dissipation device comprises a plate made of heat conductive material and forms a receptacle for receiving and at least partially enclosing and physically engaging the substrate of the light emitting diode device. The receptacle has a top wall mounted to the top of the substrate of the light emitting diode device and defines a central opening through which the light-emitting unit is exposed. The receptacle defines end openings for extension of the terminals of the light emitting diode device. A stop tab is formed in each end opening for engaging an end of the substrate and thus retaining the light emitting diode device in the receptacle. The receptacle also forms catches for engaging the bottom of the substrate of the light emitting diode device whereby the substrate of the light emitting diode device is securely retained between the top wall of the receptacle and the catches.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENTS

Figure 1:
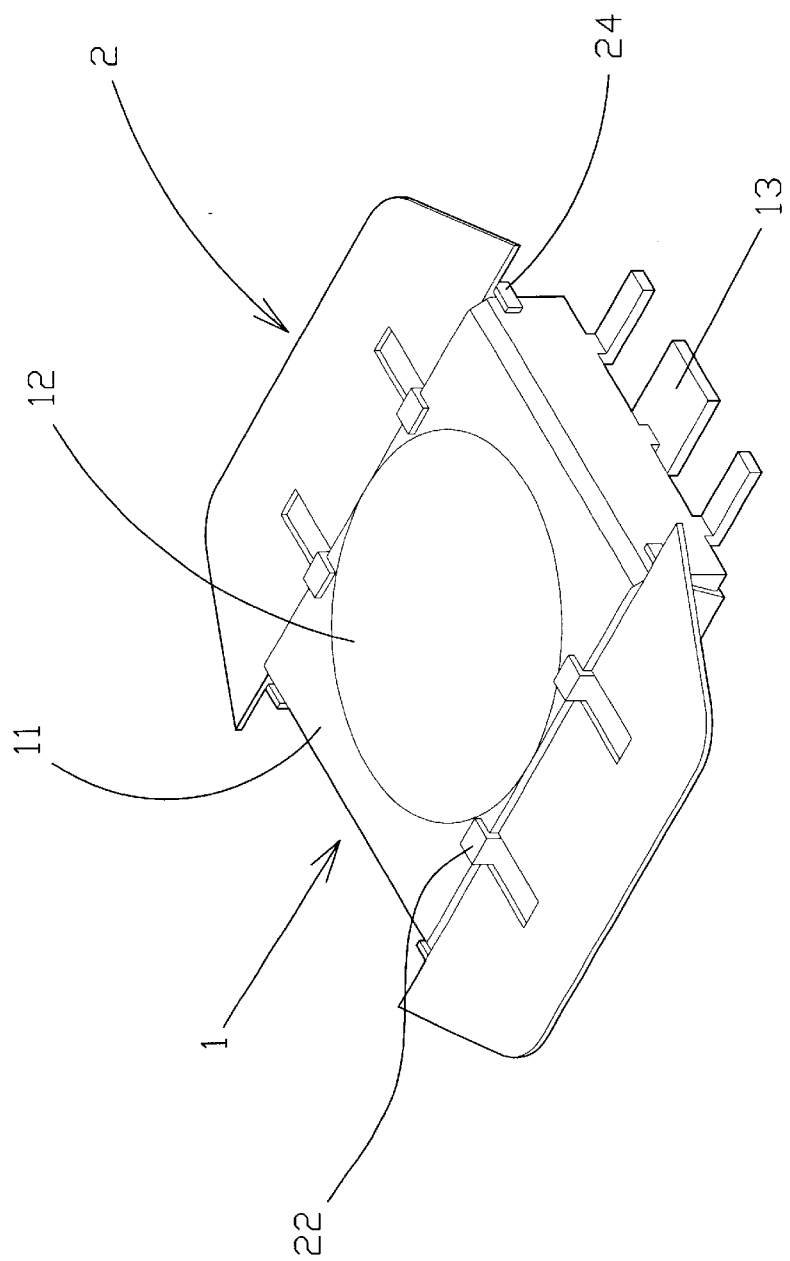
FIG. 1 is a perspective view of a light emitting diode (LED) device housed by a heat dissipation device in accordance with a first embodiment of the present invention.
Figure 2:
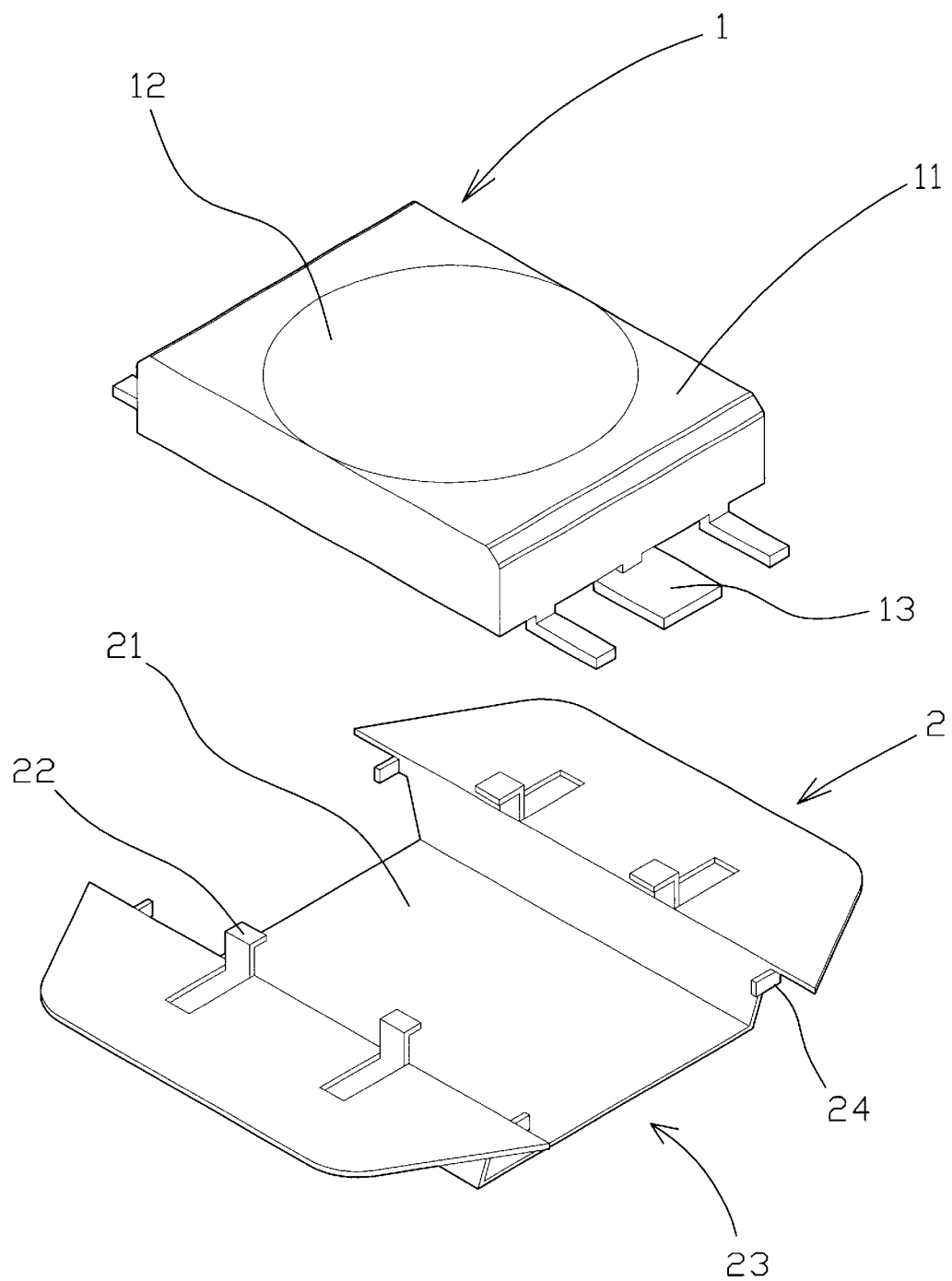
FIG. 2 is an exploded view of the LED device of FIG. 1.
Figure 3:
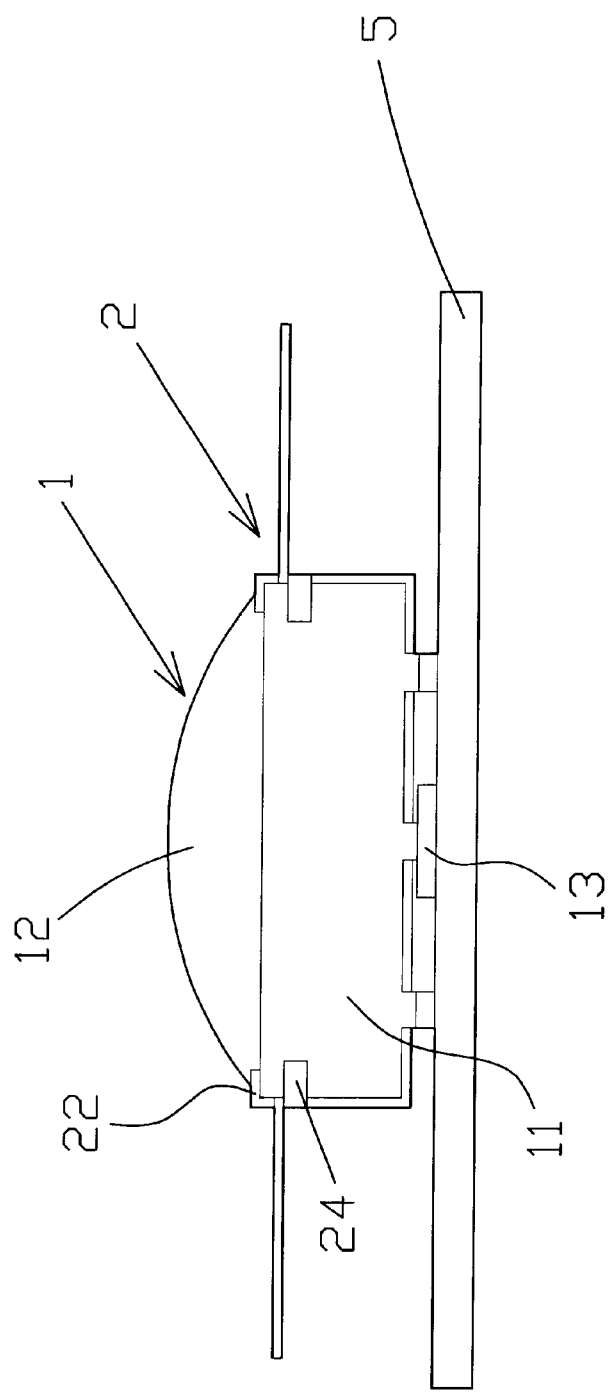
FIG. 3 is a side elevational view of the LED device of FIG. 1.

With reference to the drawings and in particular to FIGS. 1–3, an enhanced power light emitting diode (LED) device 1 that is packaged in resin or light-transmitting material comprises a substrate 11, a light-emitting unit 12 formed on a top of the substrate 11 and a plurality of terminals 13 extending from opposite edges of the bottom of the substrate 11. A heat dissipation device constructed in accordance with a first embodiment of the present invention, generally designated with reference numeral 2, is mounted to the LED device 1 for removing heat from the LED device 1. The heat dissipation device 2 is made of a plate of heat conductive material that forms a U-shaped receptacle 21 comprising two opposite side walls connected by a bottom wall. A heat-dissipating flange extends from a top edge of each side wall. An end opening 23 is defined between ends of the side walls and in communication with the receptacle 21.

The LED device 1 is received in the receptacle 21 and in partially enclosed by and physically engaging the heat dissipation device 2. The substrate 11 is interposed between the side walls of the receptacle 21 and the bottom of the substrate 11 positioned on and supported by the bottom wall of the receptacle 21. The light-emitting unit 12 is exposed through a top opening of the receptacle 21. Each side wall of the receptacle 21 forms a plurality catches 22 for engaging the top of the substrate 11 of the LED device 1 whereby the substrate 11 of the LED device 1 is securely retained in the receptacle 21 between the bottom wall of the receptacle 21 and the catches 22. Stop tabs 24 are formed on ends of the side walls of the receptacle 21 and extending from opposite edges of each end opening 23 into the end opening 23 for engaging ends of the substrate 11 of the LED device 1 thereby securely retaining the LED device 1 in the receptacle 21.

The LED device 1 is positioned in the receptacle 21 of the heat dissipation device 2 in such a way that the terminals 13 of the LED device 1 extend through the end openings 23 of the receptacle 21. The catches 23 engage the top of the substrate 11 and the stop tabs 24 engage the ends of the substrate 11 whereby the LED device 1 is securely retained in the receptacle 21. Thereafter, the terminals 13 of the LED device 1 can be soldered to a circuit board 5 (FIG. 3) to mount the LED device 1, together with the heat dissipation device 2, to the circuit board 5.

During the operation of the LED device 1, heat is generated. The heat is transmitted to the heat dissipation device 2 and radiates into the surrounding atmosphere from the heat dissipation device 2. The heat removal rate from the LED device 1 is enhanced by the heat dissipation device 2 in addition to the circuit board 5.

Figure 4:
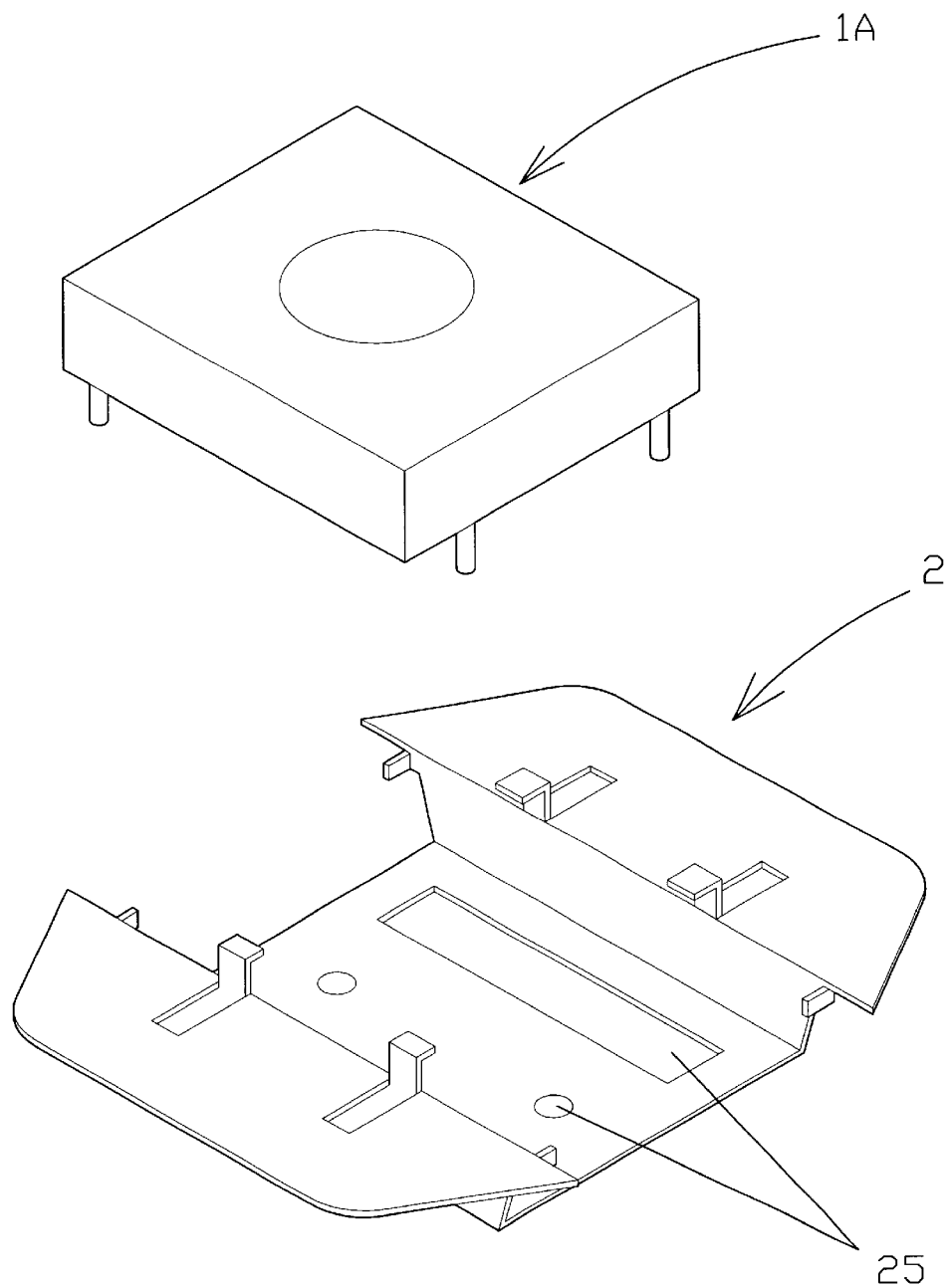
FIG. 4 is an exploded view of an LED device housed by a heat dissipation device in accordance with a second embodiment of the present invention.

FIG. 4 shows a second embodiment of the heat dissipation device in accordance with the present invention which is obtained by slightly modifying the heat dissipation device of the first embodiment and which is also designated with reference numeral 2 for simplicity. Thus, identical portions will not be further described for simplicity. The heat dissipation device of the second embodiment is made to accommodate an LED device 1A having different design of terminals. Slots or holes 25 are defined in the bottom wall of the receptacle for the extension of the terminals.

Figure 5:
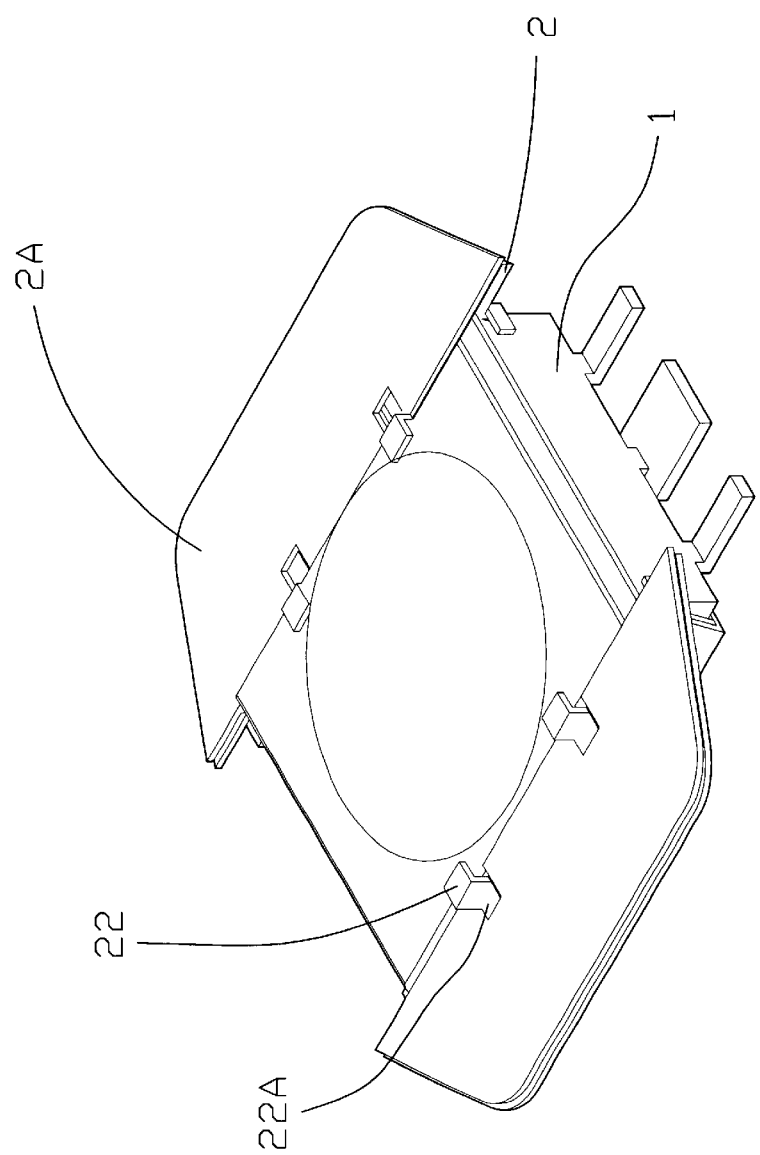
FIG. 5 is a perspective view of an LED device housed by a heat on device in accordance with a third embodiment of the present invention.
Figure 6:
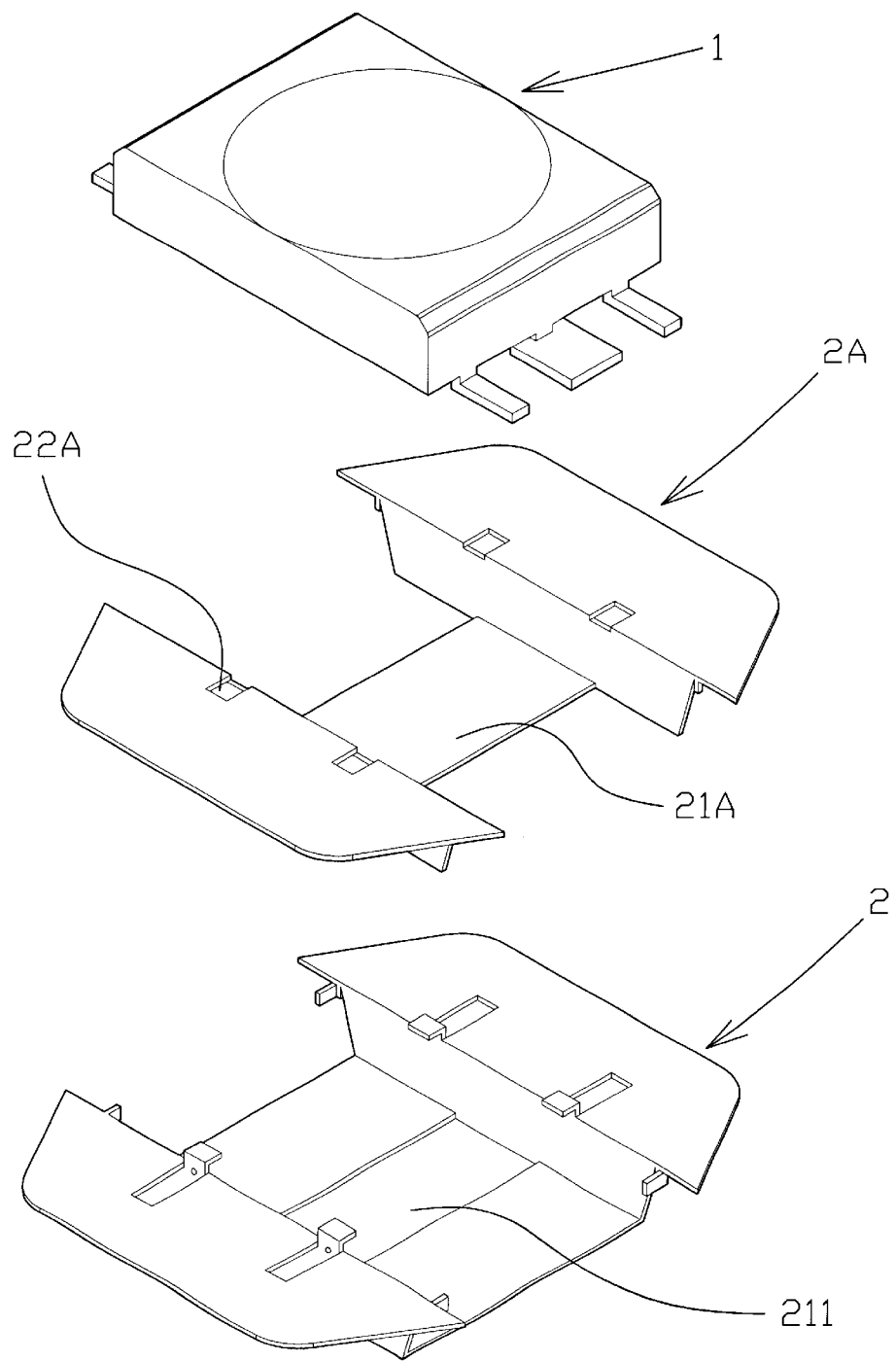
FIG. 6 is an exploded view of the LED device of FIG. 5.

FIGS. 5 and 6 show a third embodiment of the heat dissipation device in accordance with the present invention. The heat dissipation device, which is also designated with reference numeral 2 for simplicity, defines a receptacle having a bottom wall in which a cutoff 211 is defined. A secondary heat dissipation member 2A, also in the form of a U-shape, comprises a bottom wall 21A connected between two opposite side walls and heat-dissipating top flanges extending from top edges of the side walls. Openings 22A are defined in the top flanges. The secondary heat dissipation member 2A is received in the receptacle of the heat dissipation device 2 with the bottom wall 21 A fit into the cutoff 211 and the side walls of the secondary heat dissipation member 2A substantially abutting against the side walls of the heat dissipation device 2. The heat-dissipating top flanges of the secondary heat dissipation member 2A are respectively supported by the heat-dissipating flanges of the heat dissipation device 2. The LED device 1 is received in the receptacle of the heat dissipation device 2 and sandwiched between the side walls of the secondary heat dissipation member 2A. The bottom of the LED device 1 is commonly supported by the bottom walls of both the heat dissipation device 2 and the secondary heat dissipation member 2A. Catches of the heat dissipation device 2 extend through the openings 22A of the secondary heat dissipation member 2A for engaging and thus retaining the substrate of the LED device 1.

Figure 7:
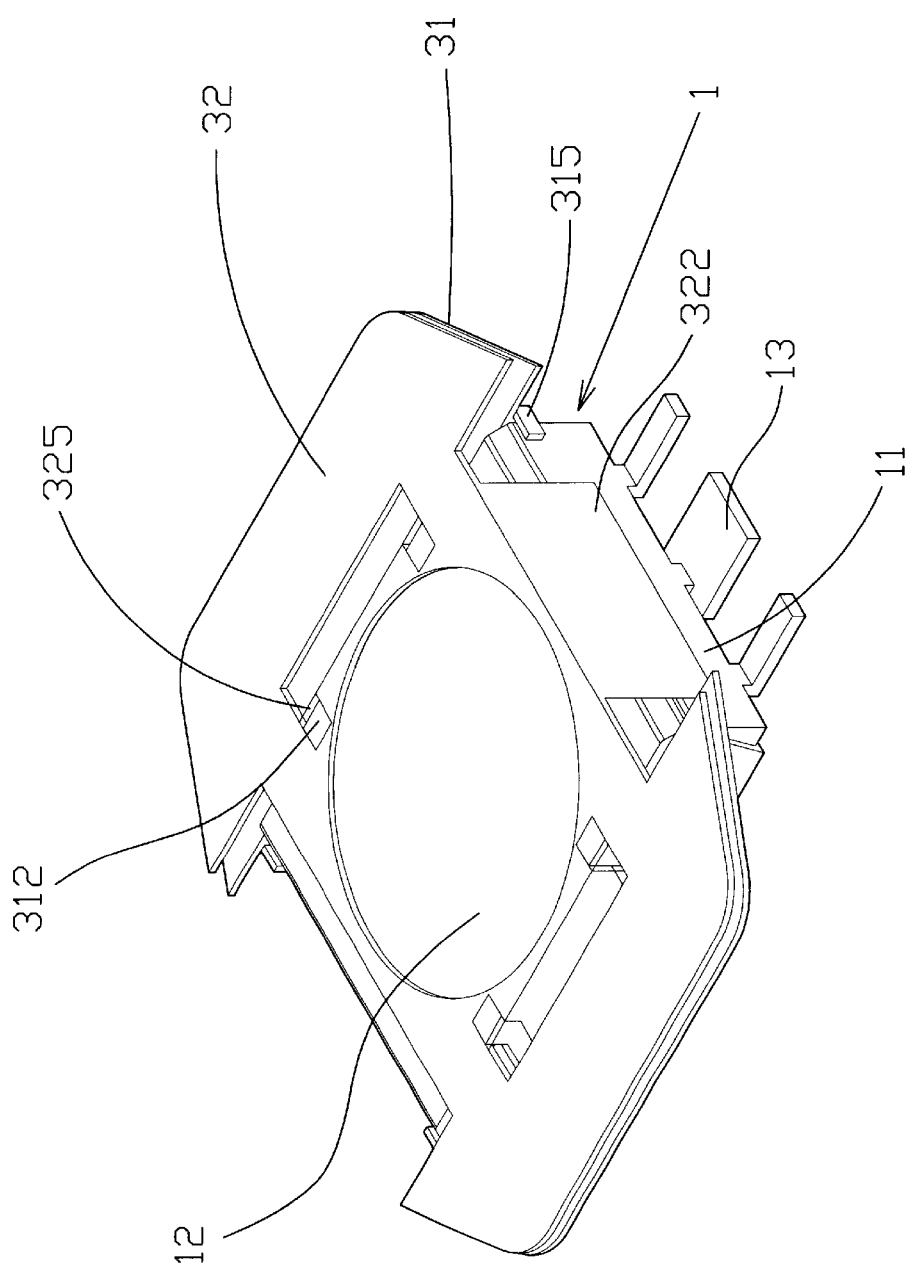
FIG. 7 is a perspective view of an LED device housed by a heat on device in accordance with a fourth embodiment of the present invention.
Figure 8:
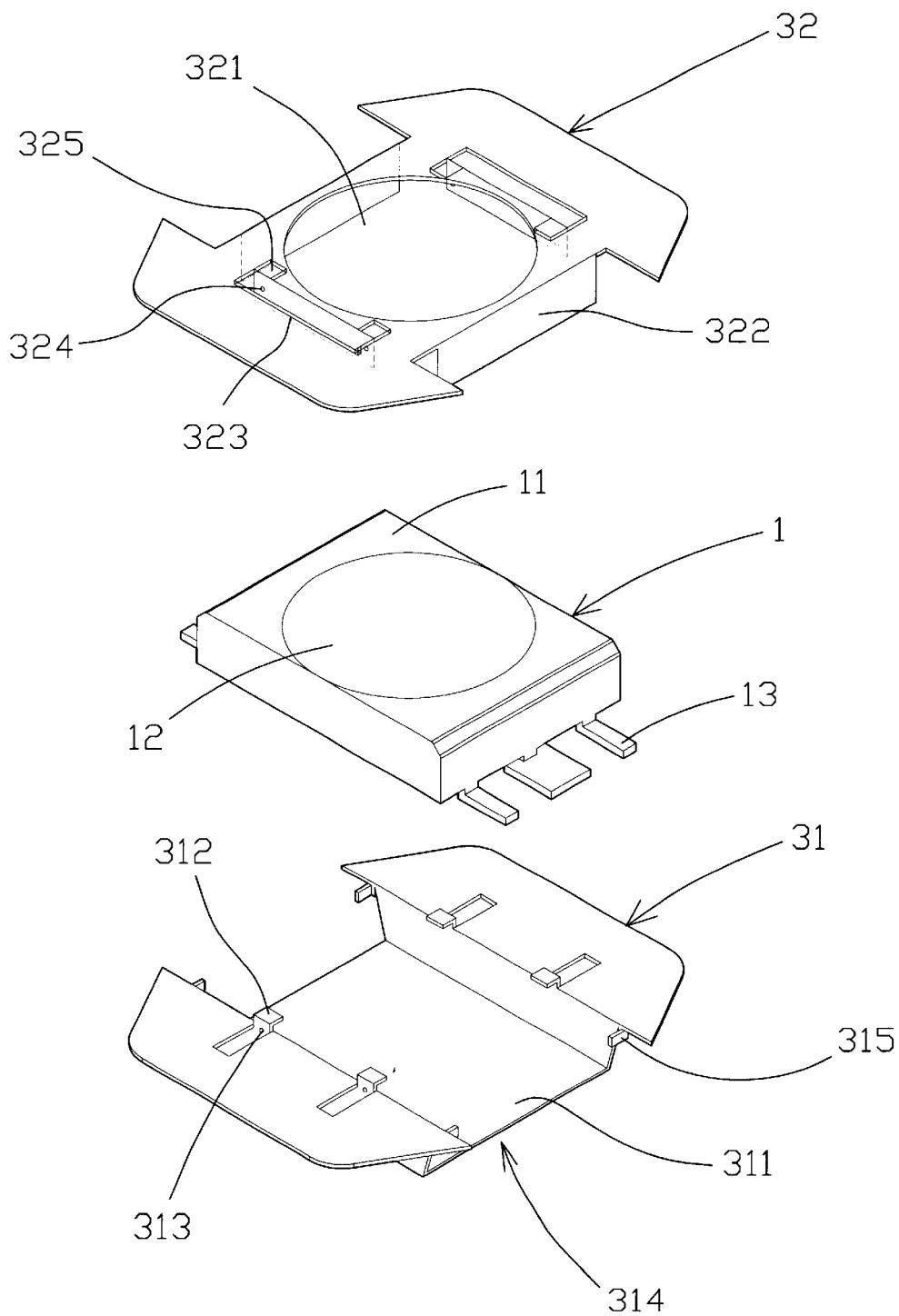
FIG. 8 is an exploded view of the LED device of FIG. 7.
Figure 9:
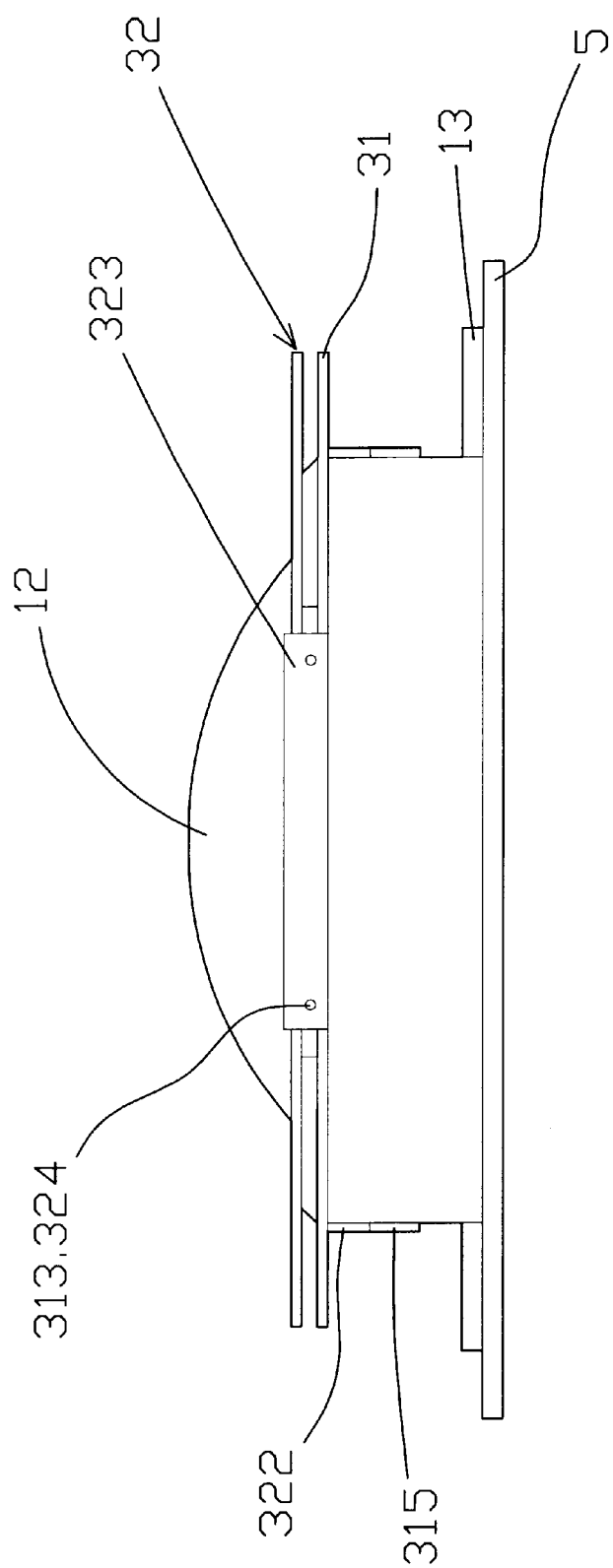
FIG. 9 is a side elevational view of the LED device of FIG. 7.

FIGS. 7–9 show a fourth embodiment of the heat dissipation device in accordance with the present invention for being externally mounted to a light emitting diode (LED) device 1. The LED device 1 comprises a substrate 11, a light-emitting unit 12 formed on a top of the substrate 11 and a plurality of terminals 13 extending from opposite edges of the bottom of the substrate 11 The heat dissipation device constructed in accordance with the fourth embodiment of the present invention, generally designated with reference numeral 3, comprises a first member 31 and a second member 32 respectively mounted to bottom and top sides of the LED device 1 for removing heat from the LED device 1.

The first member 31 is made of a plate of heat conductive material that forms a U-shaped receptacle 311 comprising two opposite side walls connected by a bottom wall A heat-dissipating flange extends from a top edge of each side wall An end opening 314 is defined between ends of the side walls and in communication with the receptacle 311. The LED device 1 is received in the receptacle 311 and partially enclosed by and physically engaging the receptacle 311. The substrate 11 is interposed between the side walls of the receptacle 311 and the bottom of the substrate 11 positioned on and supported by the bottom wall of the receptacle 311. Each side wall of the receptacle 311 forms a plurality catches 312 for engaging the top of the substrate 11 of the LED device 1 whereby the substrate 11 of the LED device 1 is retained in the receptacle 311 between the bottom wall of the receptacle 311 and the catches 312. At least one bead 313 is formed on each catch 312. Stop tabs 315 are formed on ends of the side walls of the receptacle 311 and extending from opposite edges of the each end opening 314 into the end opening 314 for engaging ends of the substrate 11 of the LED device 1 thereby securely retaining the LED device 1 in the receptacle 311.

The second member 32 is made of plate of conductive material that is mounted to and physically engages the top of the substrate 11 of the light emitting diode device 1. The second member 32 covers the top opening of the first member 31 and partially overlaps the heat-dissipating flanges of the first member 31. A central opening 321 is defined in the second member 32 for exposing the light-emitting unit 12 of the LED device 1. Two side extension 322 perpendicularly extend from opposite sides of the second member 32 for engaging the ends of the substrate 11 of the LED device 1 that expose through the end openings 314 of the first member 31 to retain the LED device 1. Two flanges 323 on opposite sides of the central opening 321 extend from the bottom wall of the first member 31 and each forms dimples 324, corresponding to and receivingly engaging the beads 313 of the catches 312 for retaining the second member 32 in position with respect to the first member 31 with the substrate 11 interposed between the first and second members 31, 32. Cutoff 325 are defined in the second member 32 for accommodating the catches 312 and allowing the catches 312 to engage and thus retain the LED device 1 in position.

The LED device 1 is positioned in the receptacle 311 of the first member 31 in such a way that the terminals 13 of the LED device 1 extend through the end openings 314 of the receptacle 311. The catches 312 engage the top of the substrate 11 and the stop tabs 315 engage the ends of the substrate 11 whereby the LED device 1 is securely retained in the receptacle 311.

The second member 32, with the central opening 321 aligned with the light-emitting unit 12 of the LED device 1, is mounted to the first member 31 by having the dimples 324 of the second members 32 engaging the beads 313 of the first member 31. The catches 312 are located in the cutoffs 324 of the second member 32. The extensions 322 of the second member 32 and the stop tabs 315 of the first member 31 together engage the ends of the substrate 11 of the LED device 1. The first and second members 31, 32 of the heat dissipation device 3 are thus securely retained on the LED device 1.

Thereafter, the terminals 13 of the LED device 1 can be soldered to a circuit board 5 (FIG. 9) to mount the LED device 1, together with the heat dissipation device 3, to the circuit board 5.

During the operation of the LED device 1, heat is generated. The heat is transmitted to the first and second members 31, 32 of the heat dissipation device 3 and radiates into the surrounding atmosphere from the first and second members 31, 32 of the heat dissipation device 3. The heat removal rate from the LED device 1 is enhanced by the first and second members 31, 32 of the heat dissipation device 3 in addition to the circuit board 5.

Figure 10:
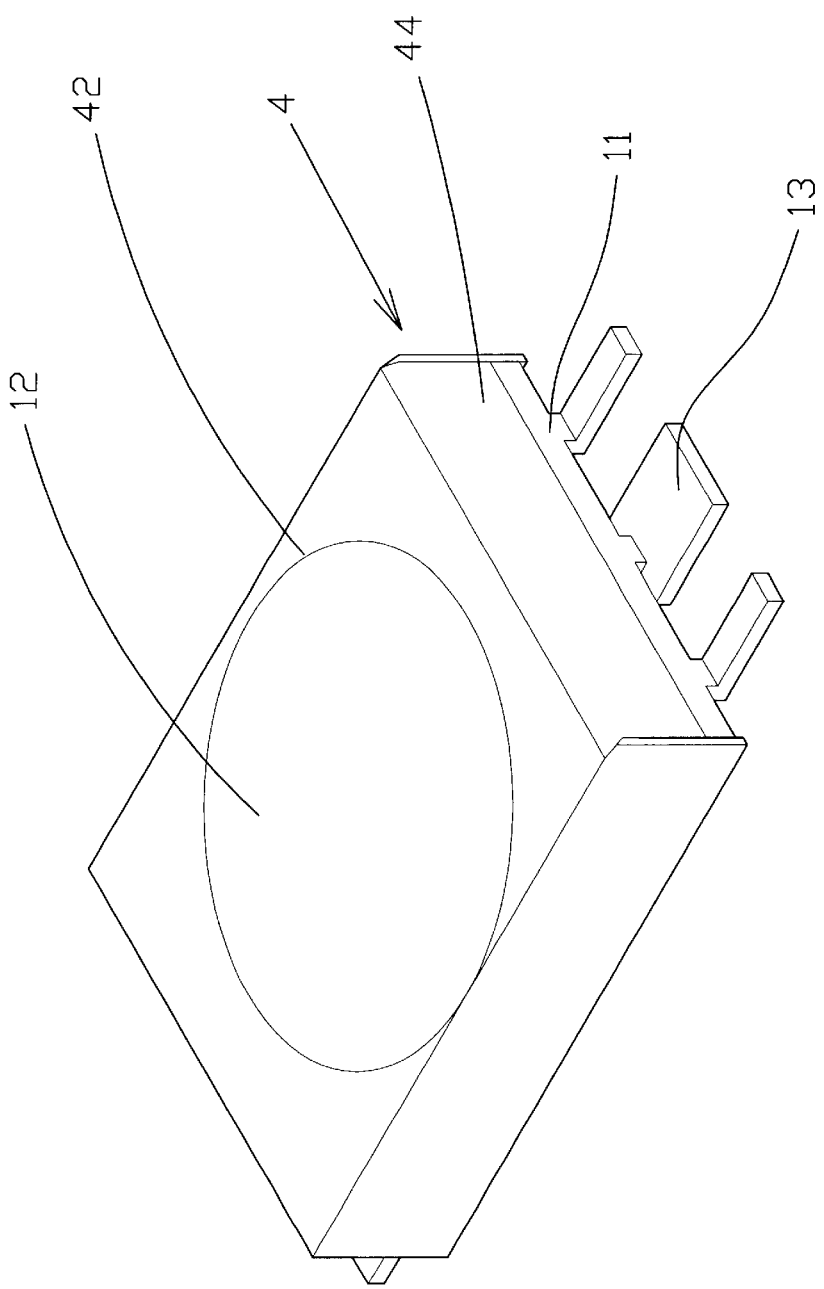
FIG. 10 is a perspective view of an LED device housed by a heat ion device in accordance with a fifth embodiment of the present invention.
Figure 11:
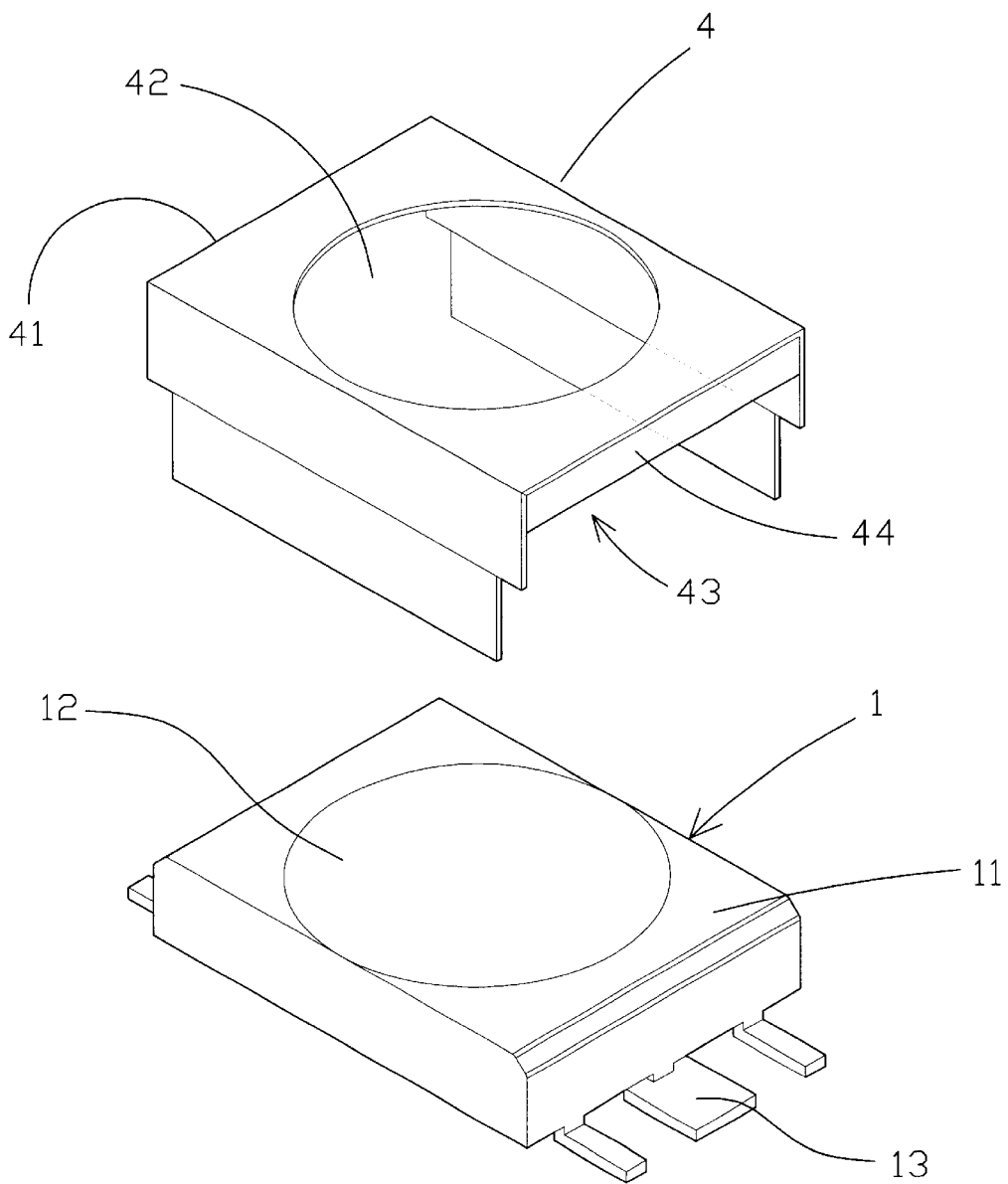
FIG. 11 is an exploded view of the LED device of FIG. 10.
Figure 12:
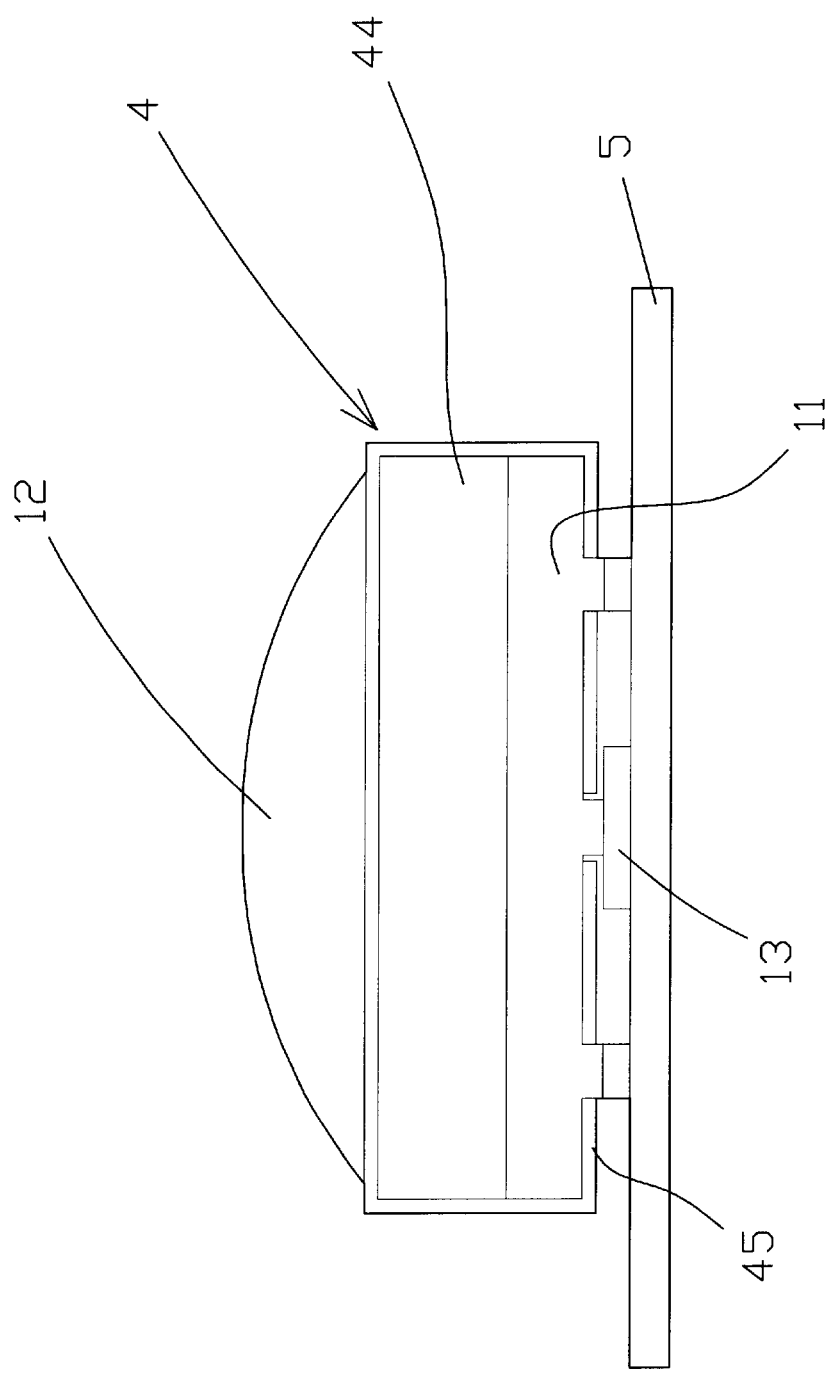
FIG. 12 is a side elevational view of the LED device of FIG. 10.
Figure 13:
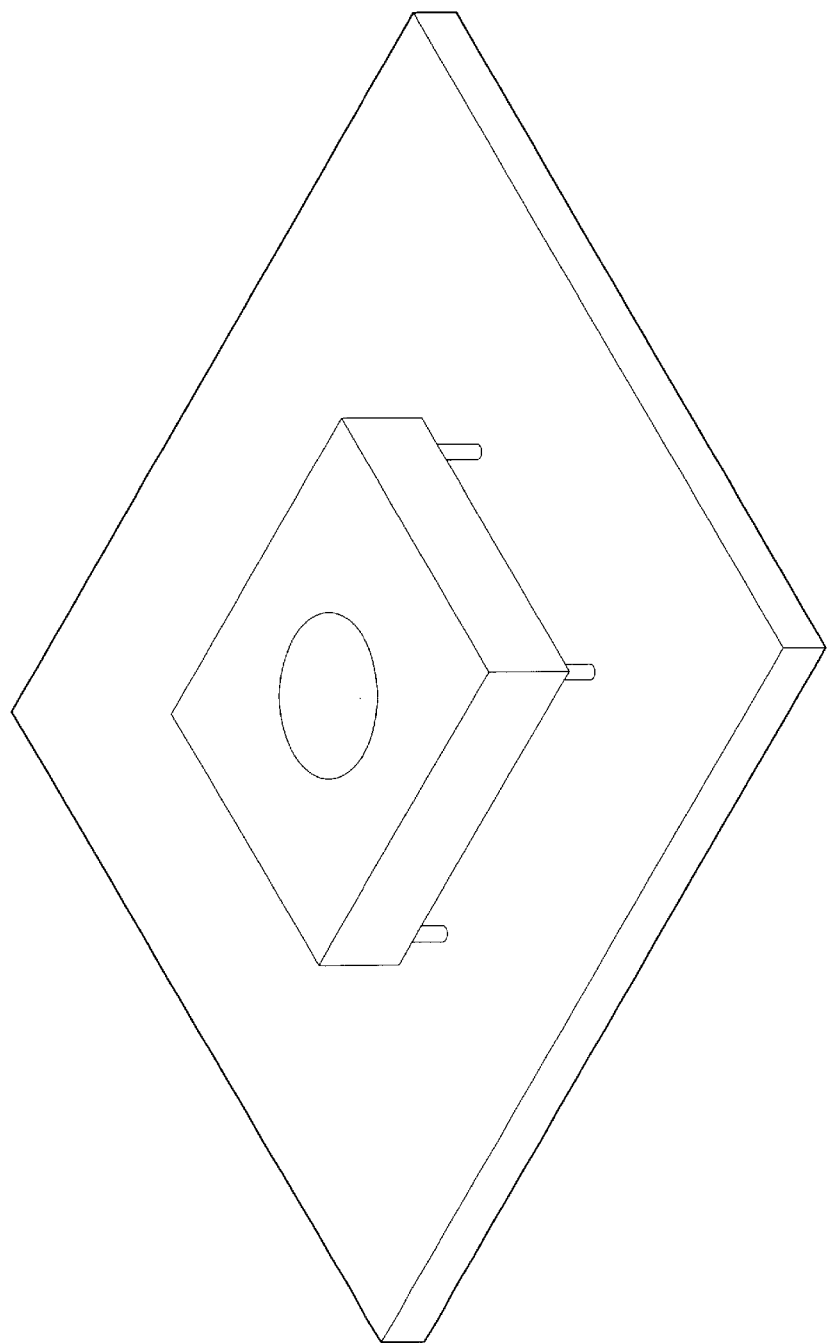
FIG. 13 is a perspective view of a conventional LED device mounted to it board.
Figure 14:
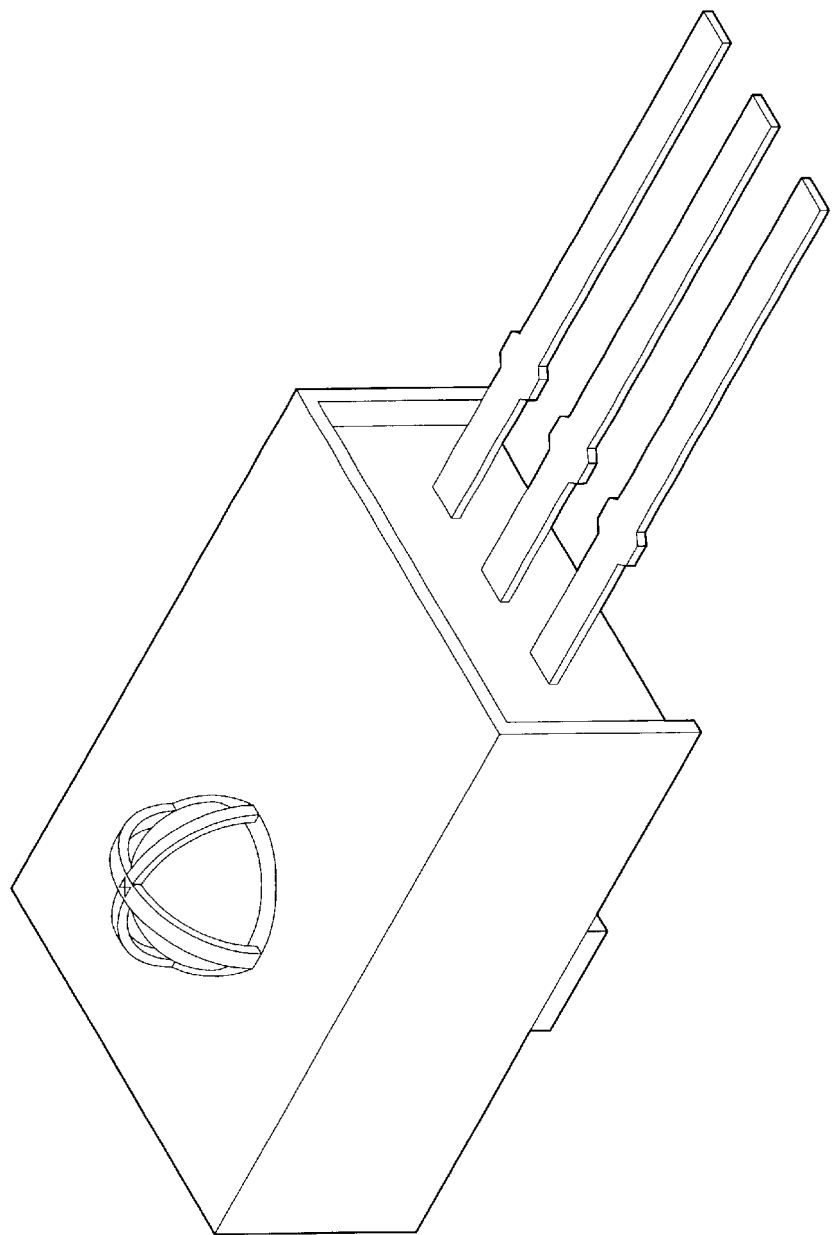
FIG. 14 is a perspective view of a conventional resin packaged diode

FIGS. 10–12 show a fifth embodiment of the heat dissipation device in accordance with the present invention for being externally mounted to a light emitting diode (LED) device 1. The LED device 1 comprises a substrate 11, a light-emitting unit 12 formed on a top of the substrate 11 and a plurality of terminals 13 extending from opposite edges of a bottom of the substrate 11. The heat dissipation device constructed in accordance with the fifth embodiment of the present invention, generally designated with reference numeral 4, is made of a plate of conductive material that forms an inverted U-shaped receptacle 41 comprising two opposite side walls connected by a top wall. An extension 45 extends from a bottom edge of each side wall. An end opening 43 is defined between ends of the side walls and in communication with the receptacle 41. The LED device 1 is received in the receptacle 41 and partially enclosed by and physically engaging the receptacle 41. The substrate 11 is interposed between the side walls and the top wall of the receptacle 41 overlaps and physically engages the top of the substrate 11. The terminals 13 extend beyond the heat dissipation device 4 through the corresponding end opening 43. The top wall of the receptacle 41 defines a central opening 42 for exposing the light-emitting unit 12 of the light emitting diode device 1. A stop tab 44 is formed in each end opening 43 and between ends of the side walls and is perpendicular to the top wall for engaging and thus retaining a corresponding end of the substrate 11 of the LED device 1.

The LED device 1 is positioned in the receptacle 41 of the heat dissipation device 4 in such a way that the terminals 13 of the LED device 1 extend through the end openings 43 of the receptacle 41 and the light-emitting unit 42 is exposed through the central opening 42. The stop tabs 44 engage the ends of the substrate 11 whereby the LED device 1 is securely retained in the receptacle 41 of the heat dissipation device 4. The extension 45 are bent to underlap the bottom of the substrate 11 of the LED device 1 thereby functioning as catches engaging the bottom of the substrate 11 so as to securely retaining the substrate 11 between the top wall of the receptacle 41 and the catches 45. Thus, the LED device 1 is securely retained in the heat dissipation device 4.

Thereafter, the terminals 13 of the LED device 1 can be soldered to a circuit board 5 (FIG. 12) to mount the LED device 1, together with the heat dissipation device 4, to the circuit board 5.

During the operation of the LED device 1, heat is generated. The heat is transmitted to the heat dissipation device 4 and radiates into the surrounding atmosphere from the heat dissipation device 4. The heat removal rate from the LED device 1 is enhanced by the heat dissipation device 4 in addition to the circuit board 5.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A heat dissipation device adapted to be mounted to a light emitting diode device for removing heat from the light emitting diode, the light emitting diode device comprising a substrate having a top on which a light-emitting unit is formed and an opposite bottom from which terminals extend, the heat dissipation device comprising a plate made of heat conductive material and forming a receptacle for receiving and at least partially enclosing and physically engaging the substrate of the light emitting diode device with the top and thus the light-emitting unit exposed through a top opening of the receptacle, the receptacle defining opposite end openings for extension of the terminals of the light emitting diode device, stop tabs being formed on opposite edges of each end opening for engaging ends of the substrate and thus retaining the light emitting diode device in the receptacle.

2. The heat dissipation device as claimed in claim 1, wherein the bottom of the substrate of the light emitting diode device is positioned on and supported by a bottom of the receptacle, the heat dissipation device further comprising catches formed on the receptacle for engaging the top of the substrate whereby the substrate of the light emitting diode is retained between the bottom of the receptacle and the catches.

3. A heat dissipation device adapted to be mounted to a light emitting diode device for removing heat from the light emitting diode, the light emitting diode device comprising a substrate having a top on which a light-emitting unit is formed and an opposite bottom from which terminals extend, the heat dissipation device being externally mounted to and at least partially enclosing and physically engaging the substrate of the light emitting diode device, the heat dissipation device comprising first and second members made of heat conductive material, the first member forming a receptacle for receiving the substrate of the light emitting diode device therein with the bottom of the substrate positioned on and supported by a bottom of the receptacle, the top and thus the light-emitting unit of the light emitting diode device being exposed through a top opening of the receptacle, the first member defining end openings for extension of the terminals of the light emitting diode device, stop tabs being formed on opposite edges of each end opening for engaging ends of the substrate and thus retaining the light emitting diode device in the receptacle, the second member being mounted to the first member and physically engaging the top of the substrate thereby interposing the substrate between the first and second members, the second member defining a central opening to expose the light-emitting unit and comprising perpendicular extensions engaging opposite ends of the substrate of the light emitting diode device.

4. The heat dissipation device as claimed in claim 3, wherein the first member further comprises catches formed on the receptacle for engaging the top of the substrate whereby the substrate is retained between the bottom of the receptacle and the catches.

5. The heat dissipation device as claimed in claim 4, wherein each catch forms a bead.

6. The heat dissipation device as claimed in claim 3, wherein the second member forms at least one flange extending toward the bottom of the first member.

7. The heat dissipation device as claimed in claim 6, wherein the flange forms a dimple engaging a corresponding bead formed on the first member to retain the first and second members together.

8. The heat dissipation device as claimed in claim 6, wherein the second member defines a cutoff for accommodating each catch of the first member.

9. A heat dissipation device adapted to be mounted to a light emitting diode device for removing heat from the light emitting diode, the light emitting diode device comprising a substrate having a top on which a light-emitting unit is formed and an opposite bottom from which terminals extend, the heat dissipation device comprising a plate made of heat conductive material and forming a receptacle for receiving and at least partially enclosing and physically engaging the substrate of the light emitting diode device, the receptacle having a top wall mounted to the top of the substrate of the light emitting diode device and defining a central opening through which the light-emitting unit is exposed, the receptacle defining end openings for extension of the terminals of the light emitting diode device, a stop tab being formed in each end opening for engaging an end of the substrate and thus retaining the light emitting diode device in the receptacle, the receptacle also forming catches for engaging the bottom of the substrate of the light emitting diode device whereby the substrate of the light emitting diode device is securely retained between the top wall of the receptacle and the catches.

* * * * *